United States Patent
Tsai et al.

(10) Patent No.: US 8,084,289 B2
(45) Date of Patent: Dec. 27, 2011

(54) METHOD OF FABRICATING IMAGE SENSOR AND REWORKING METHOD THEREOF

(75) Inventors: Hsin-Ting Tsai, Hsinchu (TW);
Cheng-Hung Yu, Taoyuan (TW);
Chin-Kuang Liu, Hsinchu (TW);
Kun-Yen Hsu, Kinmen (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/714,093

(22) Filed: Feb. 26, 2010

(65) Prior Publication Data

US 2011/0212567 A1 Sep. 1, 2011

(51) Int. Cl.
*H01L 21/00* (2006.01)

(52) U.S. Cl. ........................ 438/70; 257/59

(58) Field of Classification Search ............... 438/70
See application file for complete search history.

(56) References Cited

U.S. PATENT DOCUMENTS

| | | | | |
|---|---|---|---|---|
| 5,078,475 | A * | 1/1992 | Sekimura et al. | 349/138 |
| 6,414,343 | B1 * | 7/2002 | Kondo et al. | 257/294 |
| 6,872,322 | B1 * | 3/2005 | Chow et al. | 216/67 |
| 2002/0119245 | A1 * | 8/2002 | Verhaverbeke | 427/58 |
| 2005/0106888 | A1 * | 5/2005 | Chiu et al. | 438/710 |
| 2008/0174015 | A1 * | 7/2008 | Herrin et al. | 257/741 |
| 2009/0124037 | A1 | 5/2009 | Yu | |
| 2009/0146148 | A1 * | 6/2009 | Pyo | 257/59 |
| 2009/0146235 | A1 * | 6/2009 | Kawasaki | 257/432 |
| 2009/0170233 | A1 * | 7/2009 | Yun | 438/65 |

* cited by examiner

*Primary Examiner* — Thao Le
*Assistant Examiner* — Kimberly Trice
(74) *Attorney, Agent, or Firm* — Chun-Ming Shih

(57) ABSTRACT

A method of fabricating an image sensor device is provided. First, a substrate comprising a pixel array region and a pad region is provided. A patterned metal layer and a first planarization layer having an opening exposing the patterned metal layer in the pad region are sequentially formed on the substrate. A color filter array is formed on the first planarization layer in the pixel array region. A second planarization layer is formed to cover the color filter array and filled into the opening. A plurality of microlens is formed above the color filter array on the second planarization layer. A capping layer is conformally formed on the microlens and the second planarization layer. An etching step is performed to remove the capping layer and the second planarization layer in the opening so as to expose the patterned metal layer in the pad region.

11 Claims, 8 Drawing Sheets

METHOD OF FABRICATING IMAGE SENSOR AND REWORKING METHOD THEREOF

BACKGROUND

1. Technical Field

The present invention relates to a method of fabricating a semiconductor device, and more particularly to a method of fabricating an image sensor and a method of reworking an image sensor.

2. Description of the Related Art

Generally, optoelectronic devices that may convert light into electronic signals include CMOS image sensors (CISs) and charge coupled devices (CCDs).

Because the CMOS image sensors can be used in a low voltage condition and fabricated by a CMOS process, production cost and size of the CMOS image sensors can be reduced dramatically. And thus, the CMOS image sensors have replaced the charge coupled devices to be used in digital electronics gradually.

FIG. 1 is a schematic, side cross-sectional view of a conventional CMOS image sensor.

Please referring to FIG. 1, the CMOS image sensor includes a substrate 100 having a pixel array region 101 and a pad region 103. A plurality of shallow trench isolation structures 102 and a plurality of photodiodes (not shown) formed at the photo sensitive cells 104 in the substrate 100. The shallow trench isolation structures 102 surround the photo sensitive cells 104. The CMOS transistors disposed on a surface of the substrate 100 (not shown) are electrically connected with the photo sensitive cells 104. The shallow trench isolation structures 102 are used to avoid short circuit between the photo sensitive cells 104 and the other elements.

In addition, a metal interconnect structure and a plurality of inter-layer dielectric layers 106 is disposed on the substrate 100, so as to cover the photo sensitive cells 104 and the shallow trench isolation structures 102. A plurality of patterned metal layers 108, 110 are disposed on the metal interconnect structure and a plurality of inter-layer dielectric layers 106. The patterned metal layers 110 are used as bonding pads. Another planarized layer 112 is also disposed on the substrate 100, so as to cover the patterned metal layers 108, 110. The planarized layer 112 has an opening 114 to expose the patterned metal layer 110.

A color filter array 116 is disposed corresponding to the photo sensitive cells 104 above the pixel array region 101. The color filter array 116 is made of a red filtering pattern, a green filtering pattern and a blue filtering pattern. In addition, a planarized layer 118 is disposed on the color filter array 116, and a plurality of microlenses 120 are disposed in the planarized layer 118.

In addition, a capping layer 130 that is made of an oxide layer is further formed on the microlenses 120. The capping layer 130 is used to protect surfaces of the microlenses 120.

However, the capping layer 130 can not be removed completely and easily. As such, if some defects about the color filter array 116 or the microlenses 120 are observed, before the CMOS image sensor is fabricated or when the conventional CMOS image sensor is carried out a performance testing, the color filter array 116 or the microlenses 120 would not be reworked. Consequently, some problems, such as, rejecting the whole CMOS image sensor, low product yield and high product cost, would be generated.

What is needed, therefore, is a new method of fabricating an image sensor and a new method of reworking an image sensor that can overcome the above-mentioned shortcomings.

BRIEF SUMMARY

The present invention relates to a method of fabricating an image sensor, which can simplify a fabricating process, and the image sensor that is fabricated by the method can be reworked.

The present invention also relates to a method of reworking an image sensor, which can enhance product yield and reduce product cost.

The present invention provides a method of fabricating an image sensor. Firstly, a substrate having a pixel array region and a pad region is provided, and a photo sensing unit array and a plurality of isolation structures for isolating each photo sensing unit of the photo sensing unit array are formed in the substrate. A patterned metal layer and a first planarized layer are formed from bottom to top in sequence on the substrate, the first planarized layer having an opening to expose the patterned metal layer above the pad region. A color filter array is formed on the first planarized layer above the pixel array region. Then, a second planarized layer is formed to covering the color filter array and the first planarized layer, and be filled into the opening. A plurality of microlenses are formed corresponding to the color filter array on the second planarized layer. A capping layer is formed on the microlenses and the second planarized layer conformally. Seventhly, an etching step is performed to remove the capping layer and the second planarized layer in the opening, thereby exposing the patterned metal layer above the pad region.

In an embodiment of the present invention, after forming the second planarized layer, an exposure step is further performed.

In an embodiment of the present invention, before forming the color filter array, an underlying layer is further formed on the substrate conformally to cover the first planarized layer and the patterned metal layer above the pad region. The underlying layer in the opening can be also removed when the etching step is performed. Material of the underlying layer can be photoresist material. A method for forming the underlying layer can be coating.

In an embodiment of the present invention, the capping layer can be an oxide layer.

In an embodiment of the present invention, material of the second planarized layer can be photoresist material.

In an embodiment of the present invention, the first planarized layer can include one or more dielectric material layers.

The present invention provides a method of reworking an image sensor, which is adapted to rework the image sensor fabricated by above method of fabricating the image sensor. Firstly, a first etching process is performed to remove the capping layer. A second etching process is performed to remove all layers on the first planarized layer in sequence. Then, a cleaning step is performed to remove residue on the first planarized layer.

In an embodiment of the present invention, the first etching process is an oxide etching process.

In an embodiment of the present invention, the second etching process is a plasma etching process.

In an embodiment of the present invention, the cleaning step includes using a basic solvent.

In an embodiment of the present invention, before performing the cleaning step, a precleaning step is further performed on the first planarized layer. The precleaning step can use a mixed solution having an organic solvent. The mixed solution can include N-Methyl-2-pyrrolidone and acetone.

In the method of present invention, until the color filter, the microlenses and the capping layer are formed in sequence, the etching step is performed to exposing the patterned metal layer above the pad region. In comparison to the conventional art, the method of the present invention can reduce a photo lithography process, thereby making the fabrication process relatively simple. Furthermore, there are not problems of incompletely removing the capping layer and over etching, so that the image sensor fabricated by the above method of present invention can be reworked. In addition, the method of reworking the image sensor of the present invention may avoid the problem that the whole image sensor should be rejected when observing the defects of the image sensor. Therefore, the product yield can be enhanced and the product cost can be reduced.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

FIGS. 2A to 2F are schematic, side cross-sectional view of an image sensor according to an embodiment of the present invention, when the image sensor is fabricated.

Figure 2A:
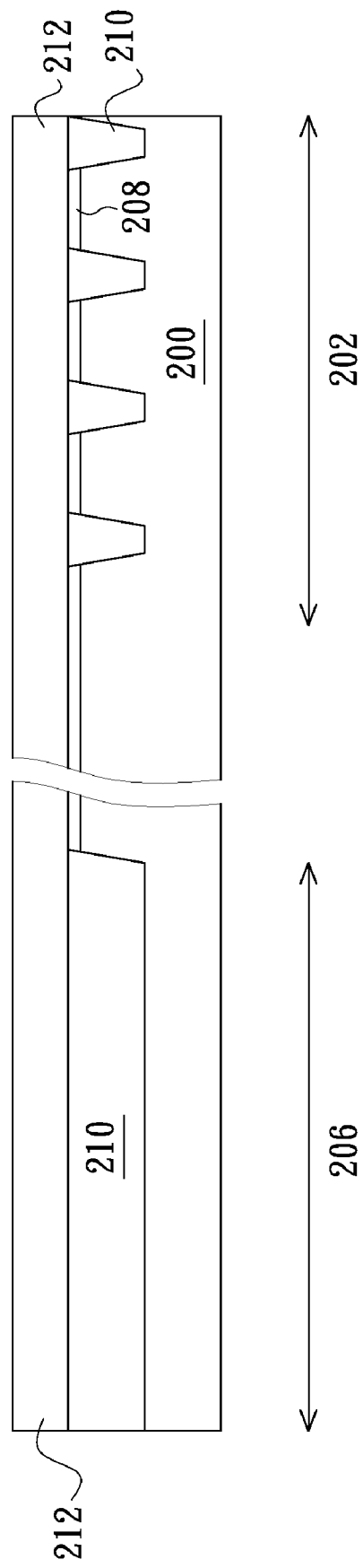
FIGS. 2A to 2F are schematic, side cross-sectional view of an image sensor according to an embodiment of the present invention, when the image sensor is fabricated.

Firstly, referring to FIG. 2A, a substrate 200 is provided. The substrate 200 can be a semiconductor substrate. The substrate 200 having a pixel array region 202 and a pad region 206. A photo sensing unit array and a plurality of isolation structures 210 are formed the substrate 200. The photo sensing unit array is made of a plurality of photo sensing units 208. The isolation structures 210 are used to isolate the photo sensing units 208. The isolation structures 210 can be shallow trench isolation structures.

Next, a metal interconnect structure and a plurality of inter-layer dielectric layers 212 is formed on the substrate 200 to cover the photo sensing units 208. The metal interconnect structure and a plurality of inter-layer dielectric layers 212 can be made by a metal etching process, a dielectric deposition process, or a metal damascene process.

Figure 2B:
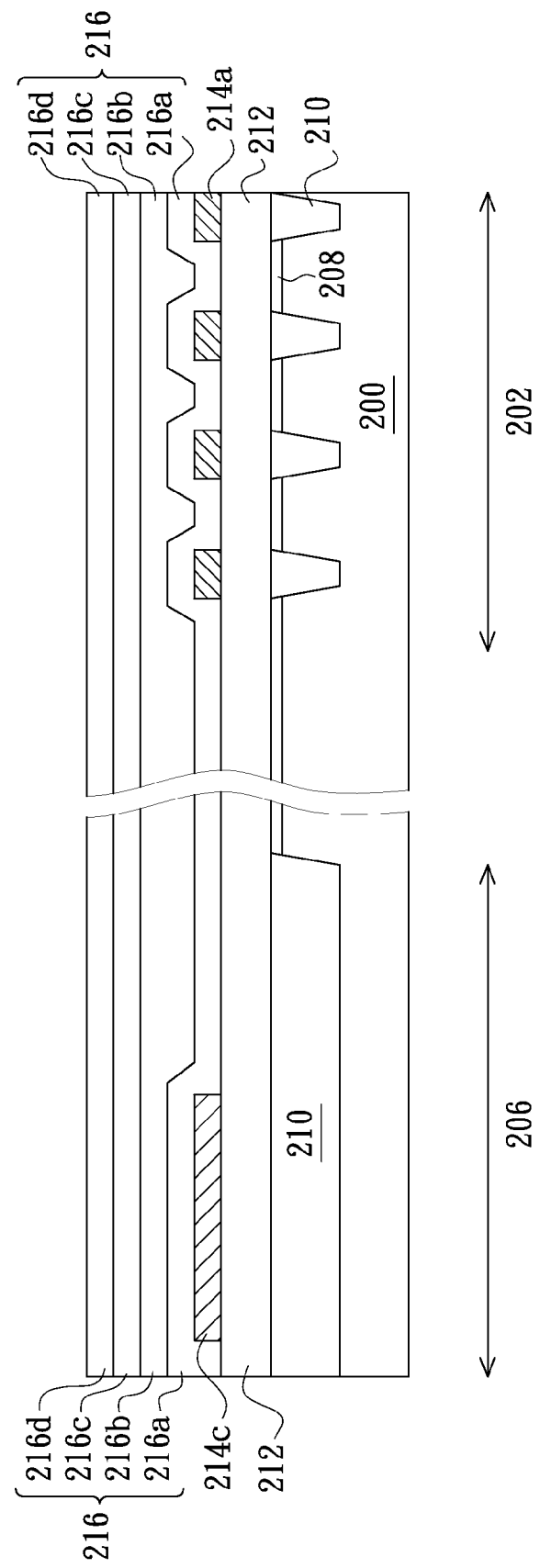

Subsequently, referring to FIG. 2B, patterned metal layers 214a, 214c are formed on the metal interconnect structure and a plurality of inter-layer dielectric layers 212 above the pixel array region 202 and the pad region 206. The patterned metal layers 214a above the pixel array region 202 can be used for shading light, and prevent the incident light from scatting. The patterned metal layer 214c above the pad region 206 is used as bonding pad. The patterned metal layers 214a, 214c can be formed by the following steps of: forming a metal layer on the metal interconnect structure and a plurality of inter-layer dielectric layers 212 by sputtering, then etching the metal layer to form the required patterns.

Next, a first planarized layer 216 is formed on the substrate 200 to cover the patterned metal layers 214a, 214c and the metal interconnect structure and a plurality of inter-layer dielectric layers 212. The first planarized layer 216 can includes a plurality of dielectric material layers, such as silicon dioxide layers 216a and 216b. The silicon dioxide 216a (also referred to as HDP layer 216a) can be formed by using high density plasma. The silicon dioxide 216b (also referred to as PETEOS layer 216b) can be formed using tetra-ethyl-ortho-silicate (TEOS) by plasma-enhanced chemical vapor deposition. Furthermore, the first planarized layer 216 can include a protective layer 216c formed on the PETEOS layer 216b. The protective layer 216c can be a silicon nitride layer formed by plasma-enhanced chemical vapor deposition. In addition, the first planarized layer 216 can further include a top oxide layer 216d formed on the protective layer 216c by disposition to prevent water vapor from entering the inside. In an alternative embodiment, the first planarized layer 216 can be a dielectric material layer. The first planarized layer 216 can be any combination of the above mentioned layers and other material layers.

Figure 2C:
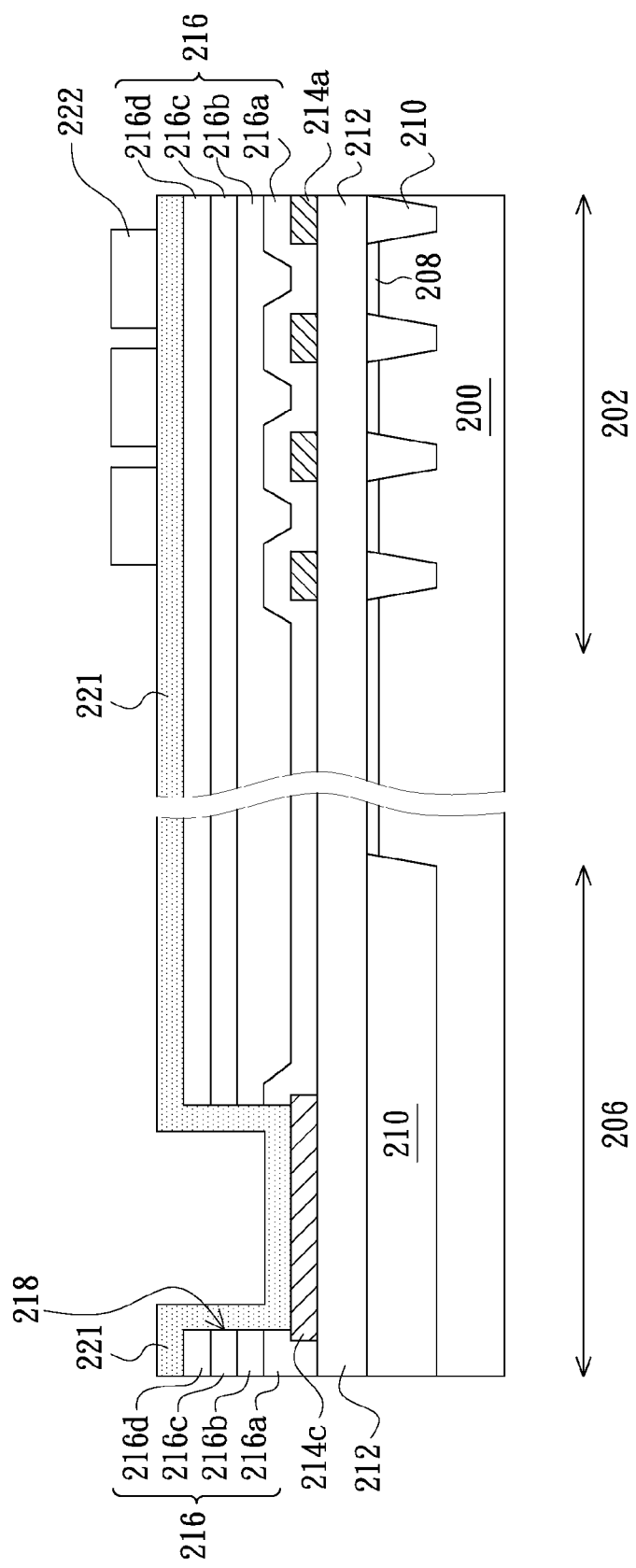

Afterwards, referring to FIG. 2C, a portion of the first planarized layer 216 above the pad region 206 is removed to form an opening 218 therein. The opening 218 exposes a surface of the patterned metal layer 214c. The portion of the first planarized layer 216 can be removed by etching.

Next, a color filter array 222 is formed on the first planarized layer 216 above the pixel array region 202. Material of the color filter array 222 is photosensitive resin. The color filter array 222 can be formed by following steps of: applying a lithography and etching process to obtain a filter array pattern, then staining the filter array pattern by dye; or forming the color filter array 222 by using photoresist material with dye directly.

In another embodiment, before the color filter array 222 is formed, an underlying layer 221 can be further formed by coating above the substrate 200 conformally to cover the first planarized layer 216 and the patterned metal layer 214c. The underlying layer 221 is used to avoid the color filter array 222 peeling during a subsequent fabrication process. Material of the underlying layer 221 can be photoresist material or other polymer material.

Figure 2D:
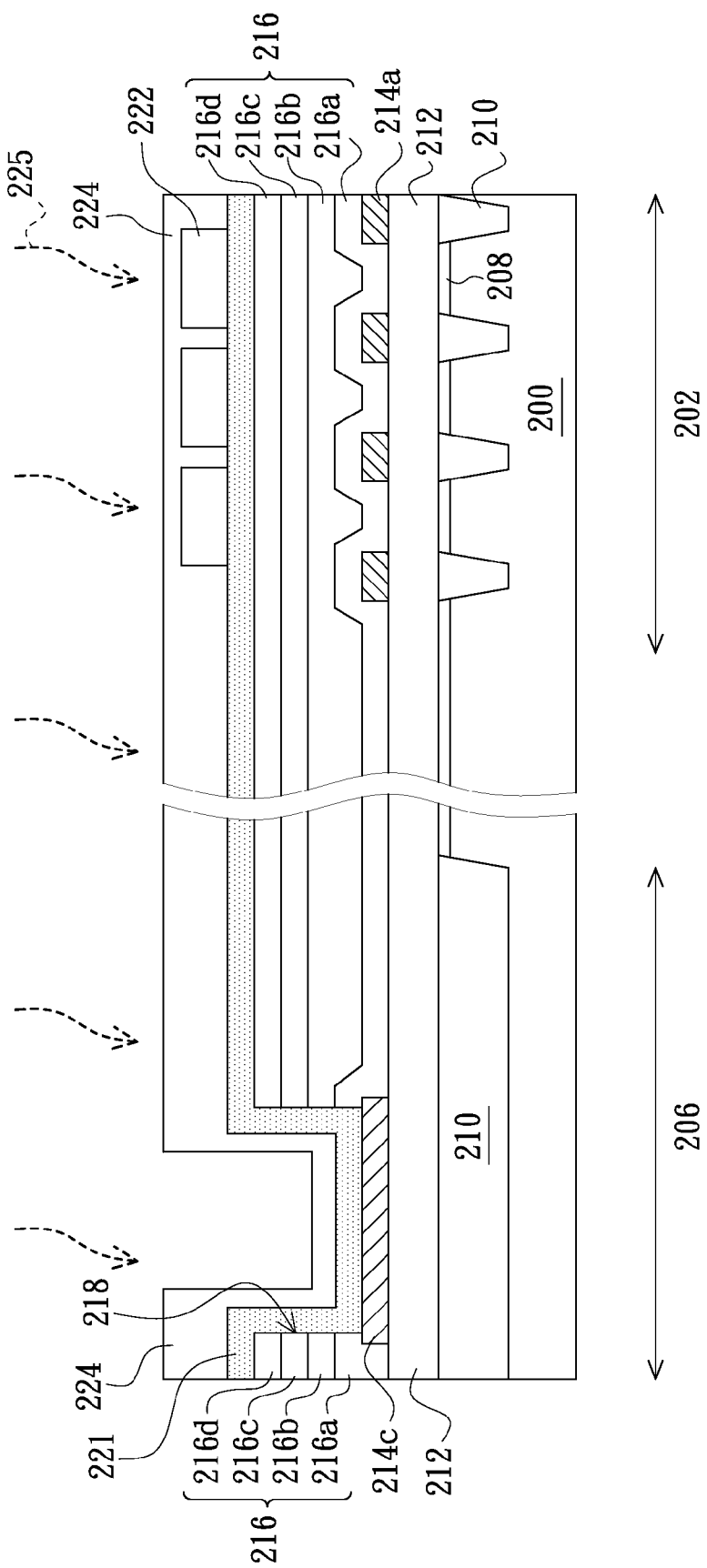

Referring to FIG. 2D, a second planarized layer 224 is formed on the first planarized layer 216. The second planarized layer 224 covers the color filter array 222 and is filled into the opening 218. Material of second planarized layer 224 can be photoresist material or other polymer material. Although the second planarized layer 224 shown in FIG. 2D is conformally filled into the opening 218, the second planarized layer 224 can also not conformally filled into the opening 218, or can almost filled into the opening 218 completely, or a top surface of the second planarized layer 224 higher than that of the first planarized layer 216 base on the thickness of the second planarized layer 224. The above embodiment is given by way of example, and not limitation.

Figure 2E:
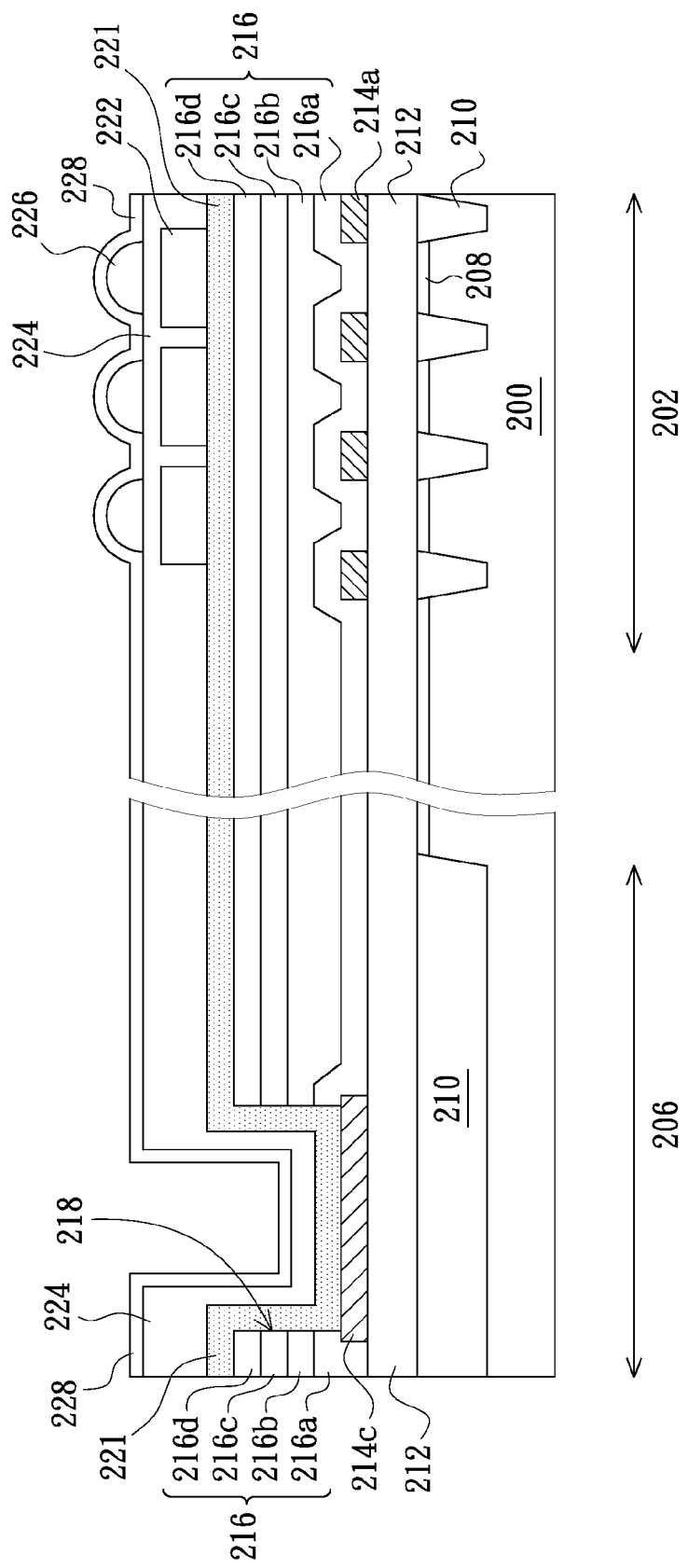

After that, referring to FIG. 2E, corresponding to the color filter array 222, a plurality of microlenses 226 are formed on the second planarized layer 224. The microlenses 226 can be formed by the following steps of: forming a polymer layer made of acrylate material, then applying an exposing, developing and reflowing process to forming the microlenses 226.

A capping layer 228 is formed on the microlenses 226 and the second planarized layer 224 conformally. The capping layer 228 can be an oxide layer. The capping layer 228 may be used to prevent surfaces of the device from damage, and have an anti-reflective performance to enhance photosensitivity of the device. Furthermore, the capping layer 228 may facilitate cleaning the surface of the device, and removing particles fallen on the surface of the device when transporting or processing, and thus the image quality of the image sensor can be improved.

Figure 2F:
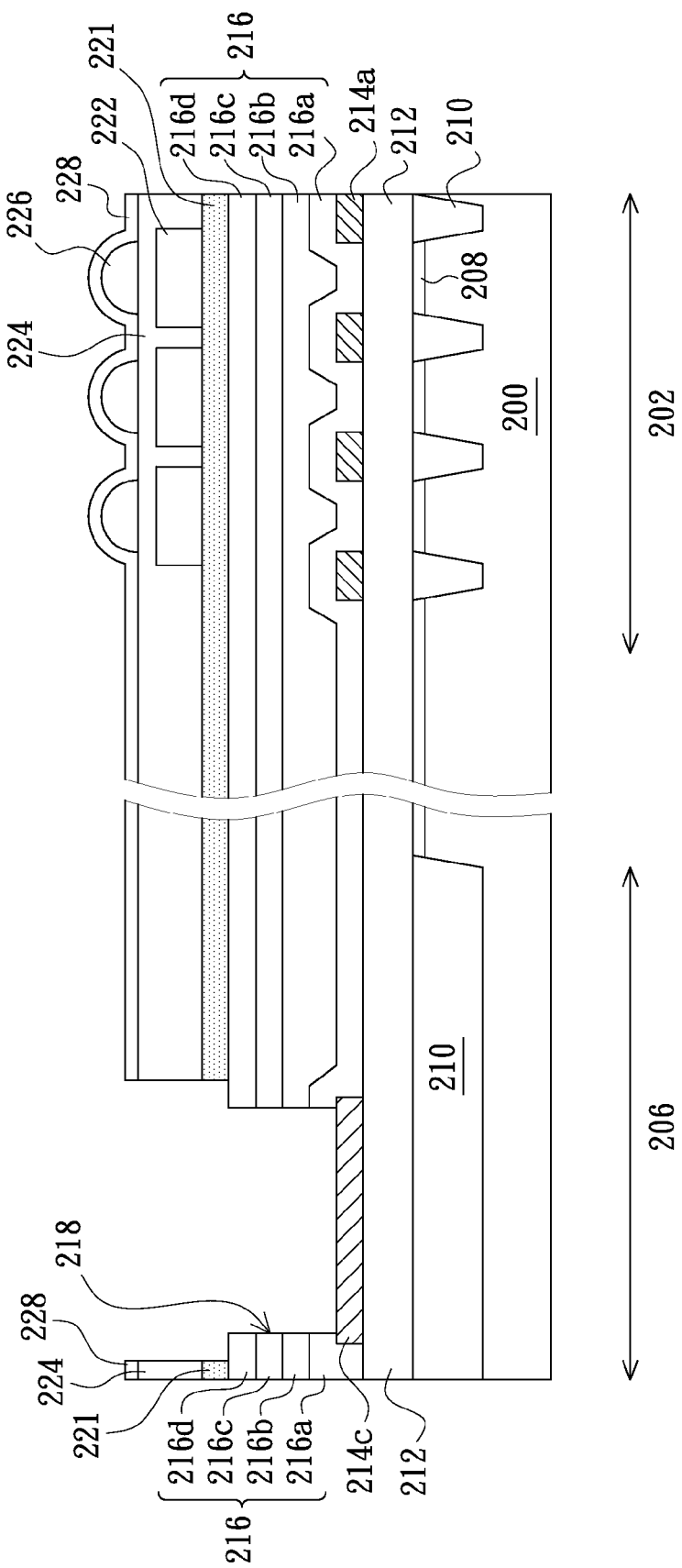

Referring to FIG. 2F, the layers in the opening 218 are removed, so as to expose the surface of the patterned metal layer 214c above the pad region 206. As such, the image sensor of the embodiment of the present invention is made. The exposed patterned metal layer 214c is used as the bonding pad for electrical connection.

As mentioned above, the layers in the opening 218 that are removed include capping layer 228 and the second planarized layer 224. Particularly, if there is the underlying layer 221 in the embodiment, the layers in the opening 218 that are removed further include the underlying layer 221. A method of removing the layers in the opening 218 may include the steps of: forming a patterning photoresist layer, then performing an etching process by applying the photoresist layer as a mask, thereby exposing the patterned metal layer 214c.

In another embodiment, after the second planarized layer 224 is formed and before the microlenses 226 are formed, an exposure step 225 can be carried out. The exposure step 225 can make thermal expansion coefficient of the second planarized layer 224 close to that of the capping layer 228. As such, the capping layer 228 can be prevented from peeling during the sequent fabrication process, thereby ensuring efficiency of the device.

As described above, in the method of present invention, until the color filter, the microlenses and the capping layer are formed in sequence, the etching step is performed to exposing the patterned metal layer that is used as the bonding pad. In comparison to the conventional art, an etching step of photo lithography would not be required in the present invention immediately after the planarized layer between the microlenses and the color filter array is formed. Therefore, the method of the present invention can reduce a photo lithography process, thereby making the fabrication process relatively simple.

Furthermore, the image sensor fabricated by the method of present invention can be reworked, so that the some problems, such as, rejecting the whole image sensor, low product yield and high product cost, would be avoided.

Figure 1:
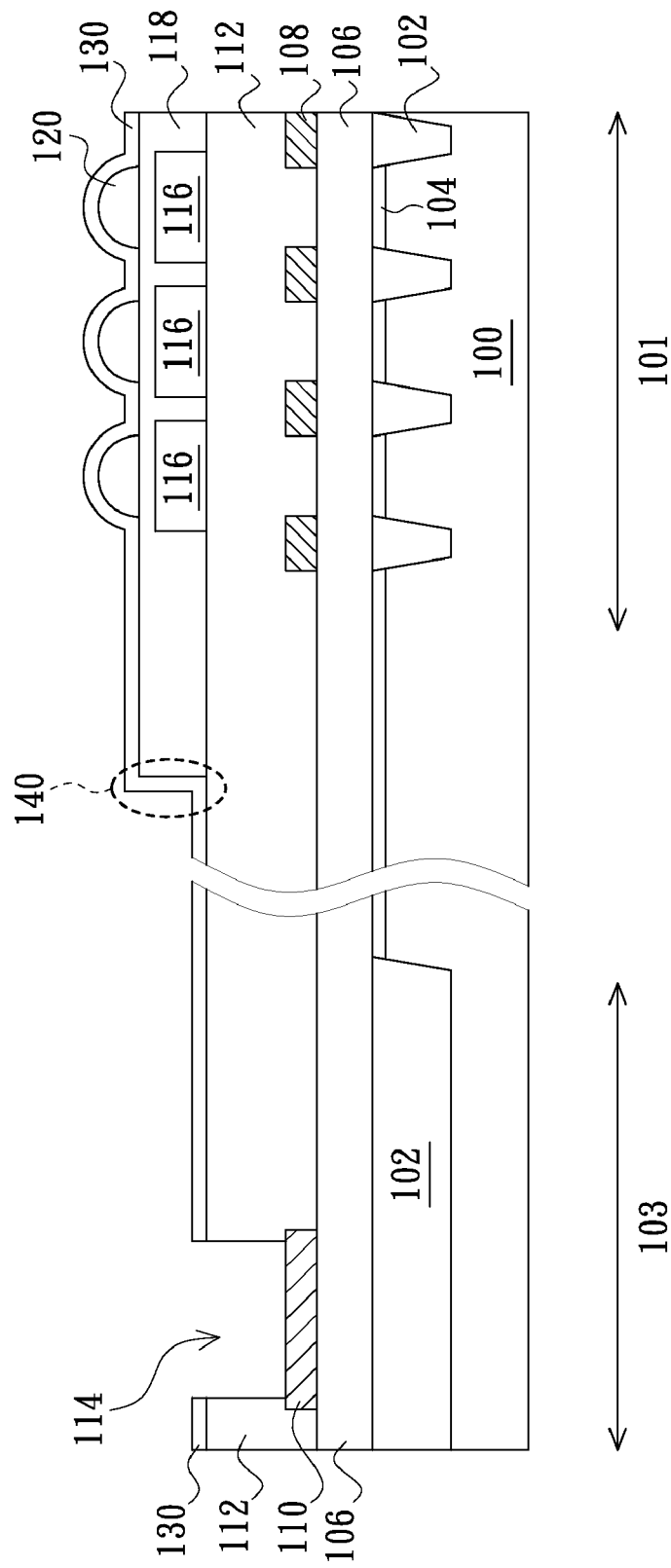
FIG. 1 is a schematic, side cross-sectional view of a conventional CMOS image sensor.

In detail, as shown in FIG. 1, when some defects about the color filter array or the microlenses are observed, the capping layer 130 (especially, the region 140 located at a sidewall of the planarized layer 118) can not be removed completely and easily. As such the color filter array or the microlenses would not be reworked. Furthermore, for removing the capping layer 130 completely, over etching would be occurred easily so as to make the device damage. On the contrary, the present invention can overcome the above problems.

The method of reworking an image sensor will be described in conjunction with FIGS. 2F and 3 as follows.

Figure 3:
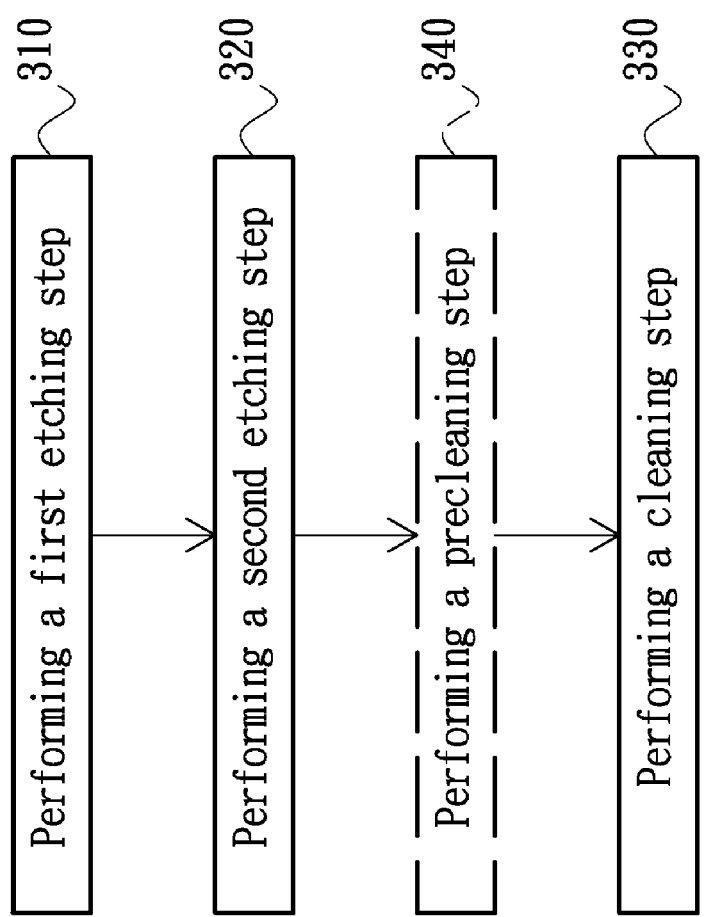
FIG. 3 is a flow chart of a method of reworking an image sensor according to an embodiment of the present invention.

FIG. 3 is a flow chart of a method of reworking an image sensor according to an embodiment of the present invention.

Please referring to FIGS. 2F and 3, firstly, a first etching step 310 is performed to remove the capping layer 228. The first etching step 310 is an oxide etching process, for example. The first etching step 310 can be performed by using hydrofluoric acid solution to etch the capping layer 228.

Subsequently, a second etching step 320 is performed to remove all layers on the first planarized layer 216 in sequence. In other words, the microlenses 226, the second planarized layer 224, the color filter array 222 and the underlying layer 221 are removed in the above mentioned order. The second etching step 320 can be performed by plasma etching using oxygen as a process gas, so as to remove the all layers on the first planarized layer 216.

Afterwards, a cleaning step 330 is performed to remove residue (polymer) that are generated in above steps. The cleaning step 330 includes using a basic solvent to clean the surface of the first planarized layer 216. The basic solvent can be GOS solvent, which can react with the acidic residue (polymer) so as to remove the residue on the first planarized layer 216. In the cleaning step 330, N-Methy1-2-pyrrolidone (NMP) can be used as a buffer solution before using the basic solvent, and after using the basic solvent, deionized water can be used to wash the surface of the first planarized layer 216 and then a steam drying process is applied by using isopropyl alcohol (IPA) so as to remove the water on the surface on the first planarized layer 216.

In an alternative embodiment, before the cleaning step 330, a precleaning step 340 can be performed on the first planarized layer 340, so as to remove the capping layer 228 completely and a portion of the residue on the first planarized layer 216. The precleaning step 340 includes using a mixed solution having an organic solvent. The mixed solution can be N-Methy1-2-pyrrolidone and acetone.

After the above reworking process finishes, a new image sensor can be fabricated by formed other elements on the first planarized layer 216, according to the method of fabricating the image sensor of the present invention.

In summary, in comparison to the conventional art, the method of the present invention can reduce the photo lithography process to make the fabrication process relatively simple.

Furthermore, in the method of fabricating an image sensor of the present invention, the capping layer can be formed to protect the surface of the image sensor, enhance photosensitivity of the image sensor and facilitate cleaning the surface of the image sensor. And there are not problems of incompletely removing the capping layer and over etching, so that the image sensor fabricated by the method of present invention can be reworked.

In addition, the method of reworking the image sensor of the present invention may avoid the problem that the whole image sensor should be rejected when observing the defects of the image sensor. Therefore, the product yield can be enhanced and the product cost can be reduced.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of reworking an image sensor, adapted to rework the image sensor fabricated by the method comprising:

providing a substrate having a pixel array region and a pad region, and a photo sensing unit array formed in the substrate;

forming a dielectric layer, a patterned metal layer and a first planarized layer from bottom to top in sequence on the substrate, the first planarized layer having an opening to expose the patterned metal layer above the pad region;

forming a color filter array on the first planarized layer above the pixel array region;

forming a second planarized layer to covering the color filter array and the first planarized layer, and be filled into the opening;

forming a plurality of microlenses corresponding to the color filter array on the second planarized layer;

forming a capping layer on the microlenses and the second planarized layer conformally; and performing an etching step to remove the capping layer and the second planarized layer in the opening and expose the patterned metal layer above the pad region, wherein the capping layer and the second planarized layer have aligned etched ends; and the reworking method comprising:

performing a first etching process to remove the capping layer;

performing a second etching process to remove all layers on the first planarized layer in sequence; and performing a cleaning step to remove residue on the first planarized layer.

2. The method of reworking an image sensor according to claim 1, wherein the first etching process is an oxide etching process.

3. The method of reworking an image sensor according to claim 1, wherein the second etching process is a plasma etching process.

4. The method of reworking an image sensor according to claim 1, wherein the cleaning step comprises using a basic solvent.

5. The method of reworking an image sensor according to claim 1, wherein before performing the cleaning step, a precleaning step is further performed on the first planarized layer.

6. The method of reworking an image sensor according to claim 5, wherein the precleaning step comprises using a mixed solution having an organic solvent.

7. The method of reworking an image sensor according to claim 6, wherein the mixed solution comprises N-Methyl-2-pyrrolidone and acetone.

8. The method of reworking an image sensor according to claim 1, wherein after forming the second planarized layer, an exposure step is further performed.

9. The method of reworking an image sensor according to claim 1, wherein before forming the color filter array, an underlying layer is further formed on the substrate conformally to cover the first planarized layer and the patterned metal layer above the pad region.

10. The method of reworking an image sensor according to claim 9, wherein the underlying layer in the opening is also removed when the etching step is performed.

11. The method of reworking an image sensor according to claim 10, wherein a method for forming the underlying layer comprises coating.

* * * * *